United States Patent
Schuegraf et al.

(10) Patent No.: US 7,067,411 B2
(45) Date of Patent: Jun. 27, 2006

(54) METHOD TO PREVENT METAL OXIDE FORMATION DURING POLYCIDE REOXIDATION

(75) Inventors: Klaus Florian Schuegraf, Tempe, AZ (US); Scott Jeffrey DeBoer, Boise, ID (US); Randhir P. S. Thakur, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/789,890

(22) Filed: Feb. 27, 2004
(Under 37 CFR 1.47)

(65) Prior Publication Data
US 2004/0171244 A1 Sep. 2, 2004

Related U.S. Application Data

(62) Division of application No. 08/902,809, filed on Jul. 30, 1997.

(51) Int. Cl.
*H01L 21/4763* (2006.01)
(52) U.S. Cl. ............... 438/595; 438/592; 257/412
(58) Field of Classification Search ............... 257/288, 257/296, 306, 412; 438/158, 184, 230, 254, 438/303, 397, 592–596
See application file for complete search history.

(56) References Cited

U.S. PATENT DOCUMENTS

| | | | | |
|---|---|---|---|---|
| 4,711,701 A | 12/1987 | McLevige | ................... | 437/41 |
| 4,774,201 A * | 9/1988 | Woo et al. | ................... | 438/303 |
| 5,032,530 A | 7/1991 | Lowrey et al. | ............... | 437/34 |
| 5,087,584 A | 2/1992 | Wada et al. | .................. | 437/43 |
| 5,103,272 A | 4/1992 | Nishiyama | ................. | 357/23.4 |
| 5,146,291 A | 9/1992 | Watabe et al. | ............. | 357/23.4 |
| 5,175,606 A | 12/1992 | Tsai et al. | ................... | 257/320 |
| 5,235,204 A | 8/1993 | Tsai | ........................... | 257/408 |
| 5,268,330 A | 12/1993 | Givens et al. | ............. | 437/195 |
| 5,272,367 A | 12/1993 | Dennison et al. | .......... | 257/306 |
| 5,364,804 A | 11/1994 | Ho et al. | ....................... | 437/41 |
| 5,371,026 A | 12/1994 | Hayden et al. | ............... | 437/41 |
| 5,382,551 A | 1/1995 | Thakur et al. | ............. | 437/247 |
| 5,397,722 A | 3/1995 | Bashir et al. | ................. | 437/41 |
| 5,422,291 A | 6/1995 | Clementi et al. | ............ | 437/43 |
| 5,425,392 A | 6/1995 | Thakur et al. | ............. | 437/173 |
| 5,438,016 A | 8/1995 | Figura et al. | ................. | 437/67 |
| 5,439,838 A | 8/1995 | Yang | ........................... | 437/43 |
| 5,459,345 A | 10/1995 | Okudaira et al. | ........... | 257/310 |

(Continued)

OTHER PUBLICATIONS

Beyers, R., "Thermodynamic Considerations in Refractory Metal Silicon-Oxygen Systems", *J. Appl. Phys., 56*, (Jul. 1984), 147-152.

(Continued)

*Primary Examiner*—David Nelms
*Assistant Examiner*—Calvin Lee
(74) *Attorney, Agent, or Firm*—Schwegman, Lundberg, Woessner & Kluth, P.A.

(57) ABSTRACT

A selective spacer to prevent metal oxide formation during polycide reoxidation of a feature such as an electrode and a method for forming the selective spacer are disclosed. A material such as a thin silicon nitride or an amorphous silicon film is selectively deposited on the electrode by limiting deposition time to a period less than an incubation time for the material on silicon dioxide near the electrode. The spacer is deposited only on the electrode and not on surrounding silicon dioxide. The spacer serves as a barrier for the electrode during subsequent oxidation to prevent metal oxide formation while allowing oxidation to take place over the silicon dioxide.

54 Claims, 2 Drawing Sheets

U.S. PATENT DOCUMENTS

| | | | |
|---|---|---|---|
| 5,468,665 A | 11/1995 | Lee et al. | 437/44 |
| 5,480,830 A * | 1/1996 | Liao et al. | 438/199 |
| 5,526,306 A | 6/1996 | Hikawa et al. | 365/182 |
| 5,538,906 A | 7/1996 | Aoki | 437/29 |
| 5,545,578 A * | 8/1996 | Park et al. | 438/303 |
| 5,583,368 A | 12/1996 | Kenney | 257/621 |
| 5,597,756 A | 1/1997 | Fazan et al. | 437/52 |
| 5,608,249 A | 3/1997 | Gonzalez | 257/306 |
| 5,624,865 A | 4/1997 | Schuegraf et al. | 438/396 |
| 5,668,394 A | 9/1997 | Lur et al. | 257/413 |
| 5,681,768 A | 10/1997 | Smayling et al. | 437/41 |
| 5,707,898 A | 1/1998 | Keller et al. | 438/265 |
| 5,739,066 A * | 4/1998 | Pan | 438/595 |
| 5,796,151 A | 8/1998 | Hsu et al. | 257/410 |
| 5,804,838 A | 9/1998 | Manning | 257/72 |
| 5,925,918 A | 7/1999 | Wu et al. | 257/413 |
| 5,929,494 A | 7/1999 | Li | 257/390 |
| 5,998,290 A | 12/1999 | Wu et al. | 438/595 |
| 6,075,274 A | 6/2000 | Wu et al. | 257/413 |
| 6,350,708 B1 * | 2/2002 | Hurley | 438/791 |

OTHER PUBLICATIONS

Glasser, Lance A., et al., "The Design and Analysis of VLSI Circuits", (1985),pp. 100-103, 176-179, 182-183.

Kasai, K., et al., "W/WNx/Poly-Si Gate Technology for Future High Speed Deep Submicron CMOS LSIs", *IEDM 1994*, (1994),497-500.

Lee, D. H., et al., "Gate Oxide Integrity (GOI) of MOS transistors with W/TiN stacked gate", *1996 Symposium on VLSI Technology Digest of Technical Papers*, (1996),208-209.

Weste, Neil H., "Principles of CMOS VLSI Design—a systems perspective", Addison-Wesley pbulishing company, 2nd ed., AT&T,(1993),pp. 71-72.

* cited by examiner

METHOD TO PREVENT METAL OXIDE FORMATION DURING POLYCIDE REOXIDATION

This application is a Divisional of U.S. application Ser. No. 08/902,809, filed on Jul. 30, 1997, issued as U.S. Pat. No. 7,009,264, which is incorporated herein.

FIELD OF THE INVENTION

The present invention relates in general to fabricating semiconductor devices, and particularly to controlling oxide formation during reoxidation.

BACKGROUND OF THE INVENTION

Advancing technology continues to pressure manufacturers to produce complementary metal-oxide semiconductor (CMOS) devices with both greater capacities and smaller profiles. To counteract the resulting parasitic effects caused by resistance/capacitance delays in gate electrodes in such down-scaled devices, there is a continual quest for new combinations of materials from which to fabricate gate structures. For example, in *W/WNx/Poly-Si Gate Technology for Future High Speed Deep Submicron CMOS LSIs*, 497–500 IEDM 1994, K. Kasai et al. describe a structure comprising tungsten, tungsten nitride and polysilicon (W/WNx/PolySi). This structure has a greatly reduced sheet resistance and enables improved performance of the CMOS device. The structure proposed by Kasai et al. is, however, limited because the structure is only able to withstand temperatures up to 900° C. for 30 seconds or less during rapid thermal annealing. Proper source/drain reoxidation requires temperatures at or above 900° C. for at least fifteen minutes. To date, where the W/WNx/PolySi structure is used, after source/drain reoxidation the wordline profile exhibits a considerable protuberance on the exposed tungsten silicide ($WSi_x$). This complicates subsequent etches, and the undesirable "spacer" implants from the gate edge decrease device performance.

In conventional processing, a conductive gate electrode is patterned into fine features by photo/etch processing. This electrode is subsequently subjected to reoxidation to repair physical damage caused by the etch process in one of two ways: either directly or through a deposited silicon dioxide spacer. For a tungsten silicide feature, this reoxidation results in $SiO_2$ growth on the polysilicon and silicide. Other choices for metal shunt layers of polysilicon include materials such as tungsten, titanium silicide and molybdenum. As described by Robert Beyers in *Thermodynamic considerations in refractory metal silicon-oxygen systems*, 147–52 Journal of Applied Physics 56(1), (July, 1984), these metals, when oxidized, result in unstable metal oxides. This is because, unlike tungsten silicide, there is little or no silicon available for oxidation into $SiO_2$.

As a result, there remains a need to be able to tap the potential of devices manufactured from materials such as tungsten and minimize the detrimental effects resulting from the formation of oxide.

SUMMARY OF THE INVENTION

The primary object of the present invention is to eliminate the aforementioned drawbacks of the prior art.

This invention proposes a method for forming an encapsulating spacer for protecting a refractory metal or polycide from forming metal oxide formation during gate stack reoxidation. According to one embodiment an encapsulating spacer is formed prior to gate stack reoxidation to prevent undesirable formation of metal oxides during this oxidation process. In another embodiment either a thin silicon nitride or amorphous silicon film is selectively deposited after gate stack patterning over a gate stack without any deposition on the active areas. This selective deposition will result in a thin film of insulating material over the gate stack which will prevent metal oxide formation during polycide (source/drain) reoxidation.

The present invention describes an improvement in the one-spacer approach because it allows source/drain reoxidation after patterning. Conventional processes using tungsten or tungsten nitride experience a "rabbit ear" problem of tungsten reoxidation after any thermal cycle more intensive than rapid thermal annealing performed at temperatures higher than 900° C.

The present invention also describes an improvement in the two-spacer approach, simplifying the double spacer deposition/etch sequence into a sequence comprising two depositions and one etch. Yet another embodiment of the present invention encapsulates refractory metal from uncontrollable oxidation during source/drain reoxidation after gate patterning.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

In conventional processing, reoxidizing a device results in silicon dioxide growth on both polysilicon and silicide features. As mentioned above, this creates an unacceptably deformed wordline profile. According to one embodiment of the present invention, the deformation is minimized by selective spacer formation on the sidewalls of tungsten silicide features. The spacer minimizes oxidation and the subsequent degradation of the feature.

Figure 1:
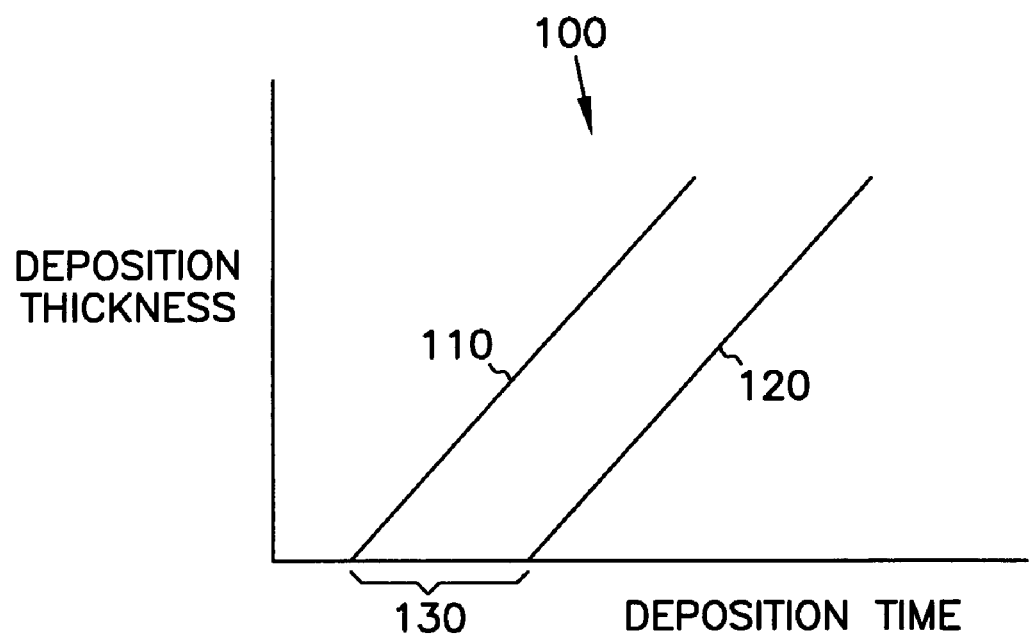
FIG. 1 is a graphic representation of the physical phenomena to be exploited for the selective spacer process.

FIG. 1 provides a graphic representation of the physical phenomena which the selective spacer process employs. The example presented shows that deposition of spacer materials on polysilicon 110 occurs more rapidly than deposition on oxide 120. Those skilled in the art will recognize that other materials may be used in place of polysilicon with similar results. The difference in incubation time 130 on dissimilar materials makes selective spacer deposition possible. For both silicon nitride and undoped polysilicon, deposition parameters (temperature, pressure, flow rates, etc.) can be adjusted to provide a rather wide incubation time difference 130. For example, in one embodiment where $Si_3N_4$ is deposited as the spacer material, a deposition difference as high as 60 Angstroms can be achieved for film deposition on different surfaces (such as silicon dioxide and silicon or polysilicon) using a temperature of 680° C., a pressure of 80 milliTorrs, and a flow ratio of 6:1.

Figure 2A:
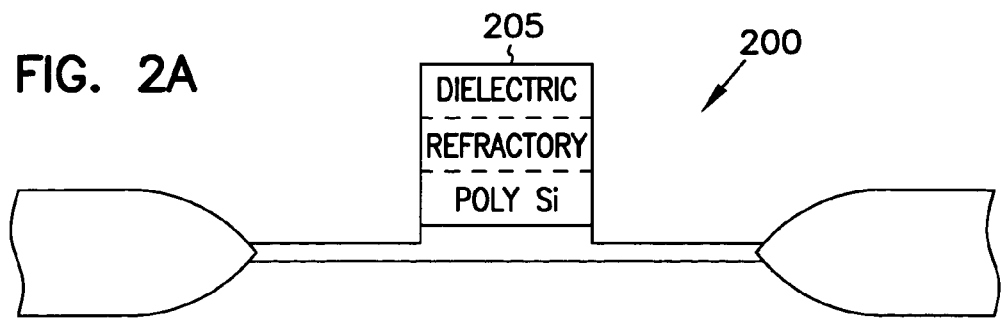
FIG. 2A is a cross-sectional view of a portion of an in-process semiconductor wafer following gate line masking and a subsequent dry etch of the exposed silicon nitride, using the polysilicon layer as the etch stop.
Figure 2B:
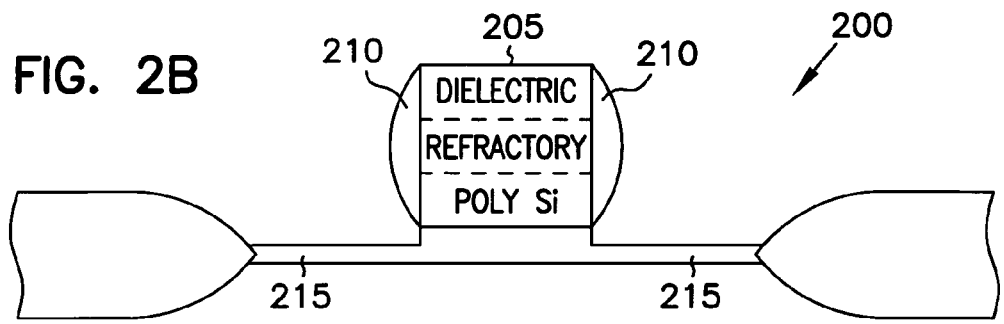
FIG. 2B is a cross-sectional view of the portion of an in-process semiconductor wafer depicted in FIG. 2A following selective spacer deposition according to one embodiment of the present invention.
Figure 2C:
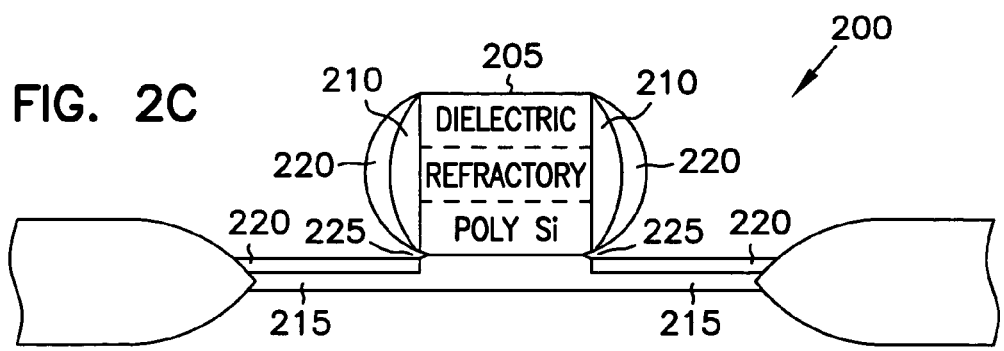
FIG. 2C is a cross-sectional view of the portion of an in-process semiconductor wafer depicted in FIG. 2B following reoxidation.

FIGS. 2A–2D show how this incubation time difference 130 can be exploited for selective spacer deposition, encapsulating refractory metal prior to polycide reoxidation. As shown in FIG. 2A, the first step is patterning an electrode 205 into fine feature. In the embodiment shown in FIG. 2A electrode 205 comprises polysilicon, a refractory metal, and a dielectric. Those skilled in the art will recognize, however, that other materials, such as undoped silicon, may be used to construct electrode 205. In the second step, represented in FIGS. 2B and 2C, a selective spacer 210 is deposited such that the amount deposited on the polysilicon and refractory metal of electrode 205 is less than the incubation thickness, leaving the oxide layer 215 free of deposition. In one embodiment the spacer comprises a thin silicon nitride, while in another it comprises an amorphous silicon film. It is to be noted that the foregoing examples are meant to be illustrative only and not limiting in any fashion.

Figure 2D:
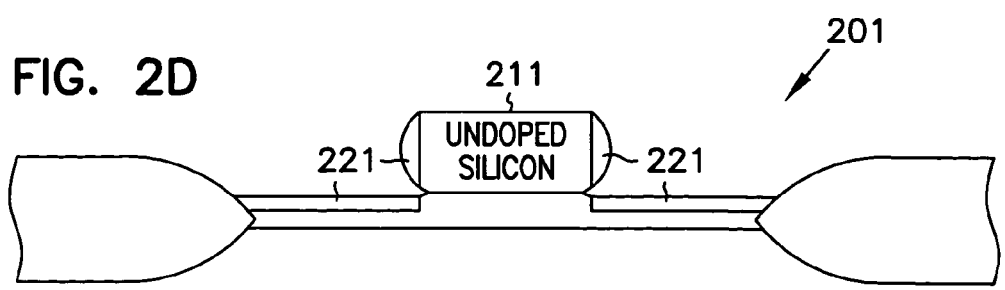
FIG. 2D is a cross-sectional view of a portion of an in-process semiconductor wafer after selective spacer deposition and reoxidation, wherein the gate line is formed of undoped silicon.

Once the spacer is deposited, the device undergoes polycide reoxidation 220. Because the spacer is selectively deposited there is no need for an additional etch step to remove excess spacer material. The oxidation process forms smile 225, and oxide layer 215 and selective spacers 210 are reoxidized 220. As can be seen, the metal portion of electrode 205 is protected by spacers 210 and thus is not subjected to the high temperature oxygen environment. Selective spacer 210 acts as a diffusion barrier preventing oxygen from reaching metal layers of electrode 205. Subsequently, an additional spacer may be deposited to the desired spacer thickness of several hundred angstroms, setting the lateral dimension of the transistor's source/drain diffusion. As shown in FIG. 2D, similar results are obtainable when electrode 205 comprises undoped silicon 211 with reoxidation 221.

The net result is that the additional step of protecting the feature can be performed though modifying process parameters and without adding any further steps to the overall process. The process described enables devices fabricated from materials such as tungsten to be more fully exploited, minimizing detrimental effects resulting from the formation of oxide, and all without increasing the cost or complexity of the fabrication process. For example, if one spacer is desired source/drain reoxidation may be performed after patterning. In contrast, conventional processes (such as the W/WNX stack described in the paper by Kasai et al.), will show a "rabbit ear" problem of tungsten reoxidation after a thermal cycle.

In a two-spacer approach, the method of the present invention simplifies the double spacer deposition/etch sequence into two deposition and one etch sequence. According to one embodiment, during source/drain reoxidation the refractory metal exposed by patterning is encapsulated, protecting the metal from uncontrollable oxidation. In contrast, conventional processing requires a deposition and etch step for each spacer before source/drain oxidation can be performed.

Is it to be recognized that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of fabricating a semiconductor device, having one or more layers of materials deposited on a polysilicon layer, comprising:
    forming one or more features on the semiconductor device, each of the one or more features having sidewalls;
    selectively depositing a first spacer comprising silicon nitride or an amorphous silicon film only on the sidewalls of each of the one or more features; and
    reoxidizing the semiconductor device.

2. The method of claim 1, wherein forming one or more features comprises selectively etching the one or more features having sidewalls, thereby exposing the one or more layers of materials.

3. The method of claim 2, wherein the polysilicon layer serves as an etch stop.

4. The method of claim 1, wherein selectively depositing a first spacer further comprises limiting a deposition time to be less than an incubation time.

5. The method of claim 1, wherein selectively depositing a first spacer further comprises selectively depositing a thin silicon nitride.

6. The method of claim 1, further comprising:
    forming a layer of gate oxide on a semiconductor layer; and
    wherein:
        forming one or more features further comprises patterning one or more electrodes on the gate oxide, each electrode comprising polysilicon, a refractory metal, and a dielectric;
        selectively depositing a first spacer further comprises depositing the first spacer on the sidewalls of each electrode, the first spacer extending to and terminating at a boundary between each electrode and the gate oxide;
        reoxidizing the semiconductor device comprises forming a layer of reoxidation on the first spacer and the gate oxide by a polycide reoxidation; and
        further comprising forming a smile effect with the layer of reoxidation at the boundary.

7. The method of claim 1, wherein forming one or more features further comprises patterning one or more electrodes of undoped silicon on a layer of gate oxide on a semiconductor layer.

8. The method of claim 1, wherein forming one or more features further comprises patterning one or more electrodes on a layer of gate oxide on a semiconductor layer, each electrode comprising polysilicon, tungsten silicide, and a dielectric.

9. The method of claim 1, wherein selectively depositing a first spacer further comprises depositing $Si_3N_4$ only on the sidewalls of each of the one or more features at a temperature of 680° C., a pressure of 80 milliTorrs, and a flow ratio of 6:1.

10. The method of claim 1, further comprising depositing a second spacer to set a lateral dimension of a source/drain diffusion in the semiconductor device.

11. A method of fabricating a semiconductor device, having one or more layers of materials deposited on a polysilicon layer, comprising:
    selectively etching the semiconductor device to form one or more features having sidewalls exposing the one or more layers of materials, wherein the polysilicon layer serves as an etch stop;
    selectively depositing a first spacer comprising silicon nitride or an amorphous silicon film only on the sidewalls of each of the one or more features; and
    reoxidizing the semiconductor device.

12. The method of claim 11, wherein selectively depositing a first spacer further comprises limiting a deposition time to be less than an incubation time.

13. The method of claim 11, wherein selectively depositing a first spacer further comprises selectively depositing a thin silicon nitride.

14. The method of claim 11, further comprising:
    forming a layer of gate oxide on a semiconductor layer; and
    wherein:
        selectively etching further comprises selectively etching the semiconductor device to form one or more electrodes on the gate oxide, each electrode comprising polysilicon, a refractory metal, and a dielectric;
        selectively depositing a first spacer further comprises depositing the first spacer on the sidewalls of each electrode, the first spacer extending to and terminating at a boundary between each electrode and the gate oxide;
        reoxidizing the semiconductor device comprises forming a layer of reoxidation on the first spacer and the gate oxide by a polycide reoxidation; and
        further comprising forming a smile effect with the layer of reoxidation at the boundary.

15. The method of claim 11, wherein selectively etching further comprises selectively etching the semiconductor device to form one or more electrodes on a layer of gate oxide on a semiconductor layer, each electrode comprising polysilicon, tungsten silicide, and a dielectric.

16. The method of claim 11, wherein selectively depositing a first spacer further comprises depositing $Si_3N_4$ only on the sidewalls of each of the one or more features at a temperature of 680° C., a pressure of 80 milliTorrs, and a flow ratio of 6:1.

17. The method of claim 11, further comprising depositing a second spacer to set a lateral dimension of a source/drain diffusion in the semiconductor device.

18. A method of forming a structure for controlling current flow between a source and a drain region in a semiconductor device, comprising:
    forming an insulating layer on a semiconductor wafer;
    forming a conductive layer over the insulating layer;
    forming a gate by etching, using the insulating layer as an etch stop, wherein the gate has sidewalls exposing the conductive layer and some portion of the insulating layer;
    selectively forming a first oxidation barrier comprising silicon nitride or an amorphous silicon film only on the sidewalls of the gate; and
    reoxidizing the structure.

19. The method of claim 18, wherein selectively forming a first oxidation barrier comprises selectively depositing a thin silicon nitride on the gate without depositing any on the source and the drain regions.

20. The method of claim 18, wherein:
    forming an insulating layer comprises forming a layer of gate oxide on a semiconductor wafer;
    forming a conductive layer comprises forming a layer of polysilicon over the gate oxide;
    forming a gate further comprises forming the gate comprising polysilicon, a refractory metal, and a dielectric;
    selectively forming a first oxidation barrier further comprises depositing a first spacer on the sidewalls of the gate for a period of time less than an incubation period for the deposition on the gate oxide and to a thickness less than an incubation thickness for the deposition on the gate oxide, the first spacer extending to and terminating at a boundary between the gate and the gate oxide;
    reoxidizing the structure comprises forming a layer of reoxidation on the first spacer and the gate oxide by a polycide reoxidation; and
    further comprising forming a smile effect with the layer of reoxidation at the boundary.

21. The method of claim 18, wherein forming a conductive layer comprises forming a layer of undoped silicon.

22. The method of claim 18, wherein forming an insulating layer comprises forming a layer of gate oxide.

23. The method of claim 18, wherein forming a gate further comprises forming the gate comprising polysilicon, tungsten silicide, and a dielectric.

24. The method of claim 18, wherein selectively forming a first oxidation barrier further comprises depositing $Si_3N_4$ only on the sidewalls of the gate at a temperature of 680° C., a pressure of 80 milliTorrs, and a flow ratio of 6:1.

25. A method of forming a structure for controlling current flow between a source and a drain region in a semiconductor device, wherein the semiconductor device is composed of a semiconductor layer, an insulating layer disposed over the semiconductor layer, and a conductive layer disposed over the insulating layer, the method comprising:
    forming a gate having sidewalls exposing the conductive layer and some portion of the insulating layer;
    depositing a thin silicon nitride on the gate;
    avoiding depositing the thin silicon nitride on the insulating layer disposed above the source and the drain region; and
    reoxidizing the structure.

26. The method of claim 25, wherein avoiding depositing the thin silicon nitride on the source and the drain region comprises limiting a deposition time to be less than an incubation time.

27. The method of claim 25, wherein:
    forming a gate comprises forming a gate having sidewalls exposing the conductive layer comprising polysilicon, a refractory metal, and a dielectric and some portion of the insulating layer comprising gate oxide;
    depositing a thin silicon nitride further comprises depositing the silicon nitride on the sidewalls of the gate for a period of time less than an incubation period for the deposition on the gate oxide and to a thickness less than an incubation thickness for the deposition on the gate oxide, the silicon nitride extending to and terminating at a boundary between the gate and the gate oxide;

reoxidizing the structure comprises forming a layer of reoxidation on the silicon nitride and the gate oxide by a polycide reoxidation; and further comprising forming a smile effect with the layer of reoxidation at the boundary.

28. The method of claim 25, wherein forming a gate comprises forming a gate having sidewalls exposing the conductive layer comprising undoped silicon and some portion of the insulating layer comprising gate oxide.

29. The method of claim 25, wherein forming a gate comprises forming a gate having sidewalls exposing the conductive layer comprising polysilicon, tungsten silicide, and a dielectric and some portion of the insulating layer comprising gate oxide.

30. The method of claim 25, wherein depositing a thin silicon nitride further comprises depositing $Si_3N_4$ only on the gate at a temperature of 680° C., a pressure of 80 milliTorrs, and a flow ratio of 6:1.

31. A method of forming a semiconductor device comprising:

forming an oxide layer;

forming at least one feature over the oxide layer, the feature having a surface and being contiguous with the oxide layer at a boundary; and forming a spacer comprising silicon nitride or an amorphous silicon film covering the surface of the feature and terminating at a location adjacent to the boundary wherein the spacer is not in contact with the oxide layer.

32. The method of claim 31, wherein:

forming an oxide layer comprises forming a layer of gate oxide on a semiconductor layer;

forming at least one feature further comprises patterning one or more electrodes on the gate oxide, each electrode comprising polysilicon, a refractory metal, and a dielectric between sidewalls, the surface comprising the sidewalls;

forming a spacer further comprises depositing the silicon nitride on the sidewalls of each electrode for a period of time less than an incubation period for the deposition on the gate oxide and to a thickness less than an incubation thickness for the deposition on the gate oxide; and further comprising:

forming a layer of reoxidation on the spacer and the gate oxide by a polycide reoxidation; and forming a smile effect with the layer of reoxidation at the boundary.

33. The method of claim 31, wherein forming at least one feature further comprises patterning one or more electrodes of undoped silicon on the oxide layer.

34. The method of claim 31, wherein forming at least one feature further comprises patterning one or more electrodes comprising polysilicon, tungsten silicide, and a dielectric between sidewalls on the oxide layer, the surface comprising the sidewalls.

35. The method of claim 31, wherein forming a spacer further comprises depositing $Si_3N_4$ on the surface of the feature at a temperature of 680° C., a pressure of 80 milliTorrs, and a flow ratio of 6:1.

36. The method of claim 31, further comprising depositing a second spacer to set a lateral dimension of a source/drain diffusion in the semiconductor device.

37. A method of forming an electronic device comprising:

forming a first layer of oxide;

forming a feature over the first layer of oxide, the feature having a surface; and forming a spacer comprising silicon nitride or an amorphous silicon film only on a substantially vertical portion of the surface of the feature.

38. The method of claim 37, wherein:

forming a first layer of oxide comprises forming a layer of gate oxide on a semiconductor layer;

forming a feature further comprises patterning one or more electrodes on the gate oxide, each electrode comprising polysilicon, a refractory metal, and a dielectric between sidewalls, the surface comprising the sidewalls;

forming a spacer further comprises depositing the spacer on the sidewalls of each electrode for a period of time less than an incubation period for the deposition on the gate oxide and to a thickness less than an incubation thickness for the deposition on the gate oxide, the spacer extending to and terminating at a boundary between each electrode and the gate oxide; and further comprising:

forming a layer of reoxidation on the spacer and the gate oxide by a polycide reoxidation; and forming a smile effect with the layer of reoxidation at the boundary.

39. The method of claim 37, wherein forming a feature further comprises patterning one or more electrodes of undoped silicon on the first layer of oxide.

40. The method of claim 37, wherein forming a feature further comprises patterning one or more electrodes comprising polysilicon, tungsten silicide, and a dielectric between sidewalls on the first layer of oxide, the surface comprising the sidewalls.

41. The method of claim 37, wherein forming a spacer further comprises depositing $Si_3N_4$ only on the surface of the feature at a temperature of 680° C., a pressure of 80 milliTorrs, and a flow ratio of 6:1.

42. The method of claim 37, further comprising depositing a second spacer to set a lateral dimension of a source/drain diffusion in the electronic device.

43. A method of forming an electronic device comprising:

forming a first layer of oxide;

forming a feature over the first layer of oxide, the feature having a surface;

forming a spacer comprising silicon nitride or an amorphous silicon film only on the surface of the feature; and forming a second layer of oxide on the spacer and the first layer of oxide, the second layer of oxide forming a gap at a boundary between the feature and the first layer of oxide.

44. The method of claim 43, wherein:

forming a first layer of oxide comprises forming a layer of gate oxide on a semiconductor layer;

forming a feature further comprises patterning one or more electrodes on the gate oxide, each electrode comprising polysilicon, a refractory metal, and a dielectric between sidewalls, the surface comprising the sidewalls;

forming a spacer further comprises depositing the spacer on the sidewalls of each electrode for a period of time less than an incubation period for the deposition on the gate oxide and to a thickness less than an incubation thickness for the deposition on the gate oxide, the spacer extending to and terminating at a boundary between each electrode and the gate oxide; and forming a second layer of oxide comprises, forming a layer of reoxidation on the spacer and the gate oxide by a polycide reoxidation.

45. The method of claim 43, wherein forming a feature further comprises patterning one or more electrodes of undoped silicon on the first layer of oxide.

46. The method of claim 43, wherein forming a feature further comprises patterning one or more electrodes on the first layer of oxide, each electrode comprising polysilicon, tungsten silicide, and a dielectric between sidewalls, the surface comprising the sidewalls.

47. The method of claim 43, wherein forming a spacer further comprises depositing $Si_3N_4$ only on the surface of the feature at a temperature of 680° C., a pressure of 80 milliTorrs, and a flow ratio of 6:1.

48. The method of claim 43, further comprising depositing a second spacer to set a lateral dimension of a source/drain diffusion in the electronic device.

49. A method of forming an electronic device comprising:
forming a first layer of oxide;
forming an electrode on the first layer of oxide, the electrode having sidewalls; and
depositing a spacer comprising silicon nitride or an amorphous silicon film only on the sidewalls of the electrode, the spacer extending to and terminating adjacent to a boundary between the first layer of oxide and the sidewalls of the electrode.

50. The method of claim 49, wherein:
forming a first layer of oxide comprises forming a layer of gate oxide on a semiconductor layer;

forming an electrode further comprises patterning the electrode on the gate oxide, the electrode comprising polysilicon, a refractory metal, and a dielectric;

depositing a spacer further comprises depositing the spacer on the sidewalls of the electrode for a period of time less than an incubation period for the deposition on the gate oxide and to a thickness less than an incubation thickness for the deposition on the gate oxide; and further comprising:
forming a layer of reoxidation on the spacer and the gate oxide by a polycide reoxidation; and
forming a smile effect with the layer of reoxidation at the boundary.

51. The method of claim 49, wherein forming an electrode further comprises patterning the electrode, the electrode comprising undoped silicon on the first layer of oxide.

52. The method of claim 49, wherein forming an electrode further comprises patterning the electrode, the electrode comprising polysilicon, tungsten silicide, and a dielectric on the first layer of oxide.

53. The method of claim 49, wherein depositing a spacer further comprises depositing $Si_3N_4$ only on the sidewalls of the electrode at a temperature of 680° C., a pressure of 80 milliTorrs, and a flow ratio of 6:1.

54. The method of claim 49, further comprising depositing a second spacer to set a lateral dimension of a source/drain diffusion in the electronic device.

* * * * *